United States Patent [19]

Sumi

[11] 4,238,714
[45] Dec. 9, 1980

[54] HORIZONTAL DEFLECTION OUTPUT CIRCUIT

[75] Inventor: Takeshi Sumi, Samukawamachi, Japan

[73] Assignee: Hitachi, Ltd., Japan

[21] Appl. No.: 41,555

[22] Filed: May 23, 1979

[30] Foreign Application Priority Data

May 24, 1978 [JP] Japan .................................. 53/61124

[51] Int. Cl.$^3$ ........................ H01J 29/70; H01J 29/76
[52] U.S. Cl. .................................... 315/408; 315/399
[58] Field of Search ........................ 315/408, 399, 410

[56] References Cited

U.S. PATENT DOCUMENTS

| | | | |
|---|---|---|---|
| 4,019,093 | 4/1977 | Klein | 315/408 |
| 4,122,363 | 10/1978 | Zappala et al. | 315/408 |

*Primary Examiner*—Theodore M. Blum
*Attorney, Agent, or Firm*—Craig & Antonelli

[57] ABSTRACT

In a horizontal deflection output circuit in which a horizontal output transistor, a damper diode and a resonance capacitor are respectively connected in series with a horizontal deflection coil, a series circuit of a resistor and a capacitor is connected with the damper diode and a second diode is connected with the resistor. The time constant of the series circuit is so chosen that the second diode starts conducting current at the beginning of the horizontal scanning period, and therefore the horizontal deflection current flows through the second diode at the beginning of the horizontal scanning period so that the linearity of the horizontal deflection current can be prevented from degrading immediately after the beginning of the horizontal scanning period.

5 Claims, 3 Drawing Figures

HORIZONTAL DEFLECTION OUTPUT CIRCUIT

BACKGROUND OF THE INVENTION

1. Field of the Invention

This invention relates to a horizontal deflection output circuit for a picture tube, having a damper diode.

2. Description of the Prior Art

"Transistor Circuit Design Manual", pp. 297-302, published by Ohm Co., Tokyo, Japan, discloses a horizontal deflection output circuit in which a resonance capacitor, a horizontal output transistor and a damper diode are respectively connected in parallel with the horizontal deflection coil for a picture tube, whereby the horizontal deflection current flows through the damper diode from the beginning of the horizontal scanning period to a certain intervening instant during the period and through the horizontal output transistor from the intervening instant to the end of the horizontal scanning period while a resonant current flows through the resonance capacitor during the horizontal flyback period. Like kindred semiconductor diodes having their characteristics cut-off frequencies, the damper diode used in the well-known circuit is not free from a limitation due to its cut-off frequency and therefore its transition from the cut-off state to the conductive state never takes place instantaneously but proceeds gradually over a very short period of time, the short period being usually called a rise time. Accordingly, during the rise time, which immediately follows the start of the horizontal scanning period, the deflection current is deficient and moreover the parasitic oscillation current due to the higher harmonics contained in a flyback pulse is superimposed on the deflection current, so that the linearity of the deflection current is degraded during the rise time. Moreover, the electron beam is velocity-modulated by the parasitic oscillation component superimposed on the deflection current. This causes an undesirable variation in brightness of the reproduced picture immediately after start of the horizontal scanning period. This undesirable phenomenon brings about no specific problem in the case of an ordinary television receiver in which over-scanning is employed since the phenomenon occurring immediately after the start of the horizontal scanning period is not reproduced in that region of the picture screen which is to be seen by watchers. In the case, however, where the whole information over the entire scanning period is always reproduced in the effective region of the picture screen, some vertical strips appear near the right or left hand side of the picture screen. Further, if higher harmonic components due to the parasitic oscillation leaks into the high frequency circuit, black vertical stripes appear near the right or left hand side of the picture screen.

SUMMARY OF THE INVENTION

The object of this invention is to provide a horizontal deflection output circuit which is free from the degradation of the linearity of the horizontal deflection current, the degradation being incidental to the conventional analogous circuit.

According to this invention, which has been made to attain the above object, the damper diode is shunted with a damping means which serves as a low-impedance current path for the horizontal deflection current during at least a part of the rise time of current through the damper diode and which has little influence upon the current through the horizontal deflection coil during any period other than the rise time, whereby the degradation of the linearity of the horizontal deflection current immediately after the start of the horizontal scanning period can be prevented.

DESCRIPTION OF THE PREFERRED EMBODIMENTS

Figure 1:
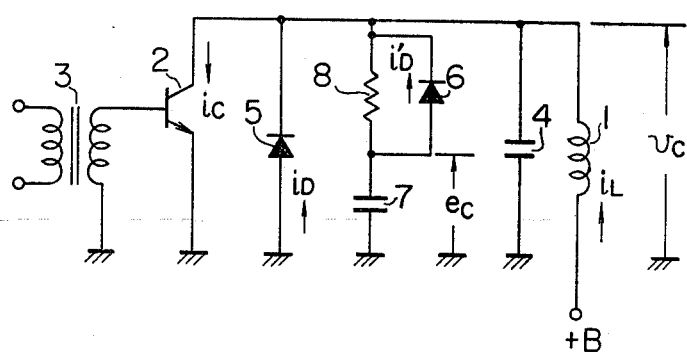
FIG. 1 show a horizontal deflection output circuit as an embodiment of this invention.

In FIG. 1, a horizontal deflection output circuit as an embodiment of this invention consists of a horizontal deflection coil 1, a horizontal output transistor 2, a drive transformer 3, a resonance capacitor 4, a damper diode 5, an auxiliary damper diode 6, a capacitor 7 and a resistor 8. The auxiliary damper diode 6, the capacitor 7 and the resistor 8 constitute a damping means as the gist of this invention. The horizontal deflection output circuit except the damping means is the same as the conventional kindreds and the description thereof will be omitted.

A horizontal flyback pulse is generated at the collector of the output transistor 2 during the flyback period $t_1$-$t_3$. The voltage waveform of the horizontal flyback pulse is as shown in FIG. 2(A), represented by reference symbol $v_c$. Since the capacitor 7 is connected via the resistor 8 with the collector of the output transistor 2, the capacitor 7 is charged and the voltage across it rises as indicated at $e_c$ in FIG. 2(B). The collector voltage $v_c$ becomes lower than its peak value appearing during the horizontal flyback period $t_1$-$t_3$ as the end $t_3$ of the horizontal flyback period draws near. At an instant $t_2$, the collector voltage $v_c$ becomes lower than the voltage $e_c$ developed across the capacitor 7 due to the charges stored therein. Accordingly, the auxiliary damper diode 6 starts conducting at the instant $t_2$ slightly earlier than the end $t_3$ of the horizontal flyback period and a current as indicated at $i'_D$ in FIG. 2(C) flows through the auxiliary damper diode 6. Since the auxiliary damper diode 6 is conductive at the end $t_3$ of the horizontal flyback period, i.e. at the beginning of the horizontal scanning period, the resonance current generated during the horizontal flyback period can flow as a deflection current through the auxiliary damper diode 6. As a result, even if the damper diode 5 conducts current incompletely in the early stage $t_3$-$t_4$ of the horizontal scanning period so that a current having a sufficient amplitude cannot flow through the damper diode 5, an ideal horizontal deflection current as the sum of $i_D$ and $i'_D$ can be obtained as indicated at $i_L$ in FIG. 2(E).

Figure 2:
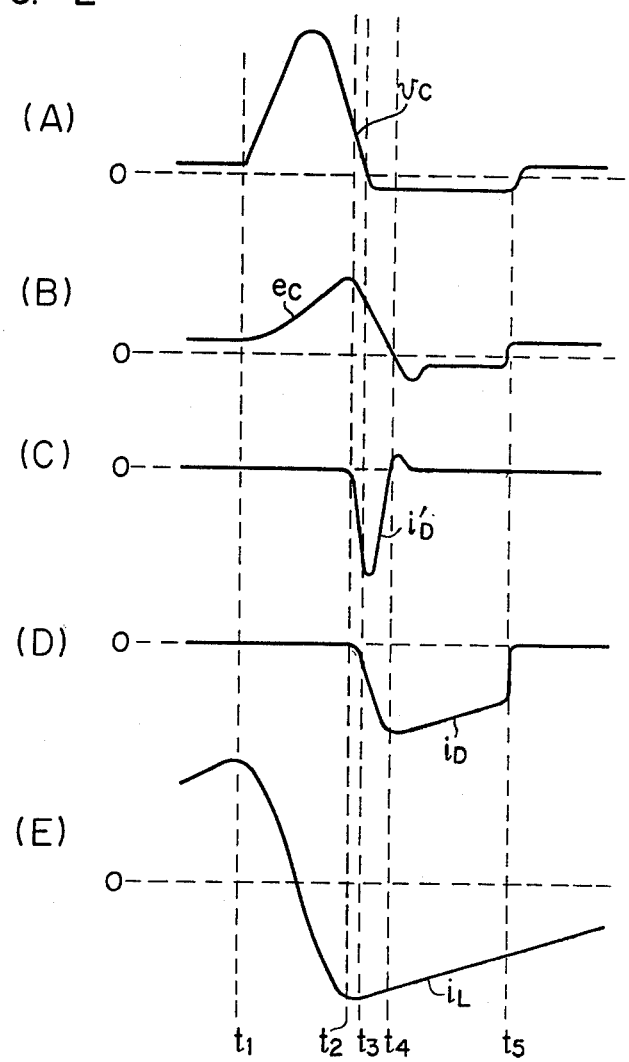
FIG. 2 shows waveforms appearing at several points in the circuit shown in FIG. 1.

By causing the auxiliary damper diode 6 to conduct current completely in the early stage $t_3$-$t_4$ of the horizontal scanning period in which the damper diode 5 cannot sufficiently perform its function because the damper current $i_D$ has an unfavourable rise time, the damping action is fully performed immediately after the horizontal flyback period so that the undesirable phenomenon taking place in the period $t_3$-$t_4$ can be prevented. The instant $t_2$ at which the auxiliary dampler diode 6 starts conducting current, is determined by the time constant determined by the capacitor 7 and the resistor 8. Accordingly, the instant at which the auxiliary damper current $i'_D$ starts flowing can be set by controlling the time constant. The waveform of the deflection current during the period $t_3$–$t_4$ can be controlled by controlling the time constant. In FIG. 2, the period $t_2$—$t_4$, which is a very short duration, has its time base magnified to facilitate observations.

Figure 3:
FIG. 3 shows a variation of the principal portion of the circuit shwon in FIG. 1.

The same effect as obtained by the embodiment shown in FIG. 1 can also be enjoyed by substituting a series circuit of a zener diode 11 and a capacitor 12, as shown in FIG. 3, for the circuit consisting of the auxiliary damper diode 6, the capacitor 7 and the resistor 8, i.e. by shunting the damper diode 5 with the series circuit. In that case, the zener diode 11 serves as a damper during the period $t_3$–$t_4$ and the instant $t_2$ at which a forward current starts flowing through the zener diode 11 can be controlled by controlling the attainable voltage across the capacitor 12 and therefore the zener voltage of the diode 11.

As described above, according to this invention, the mere addition of a simple circuit to the conventional circuit configuration can reduce or prevent the distortion of the deflection current and moreover can improve the linearity of the reproduced picture and eliminate the variation in brightness due to the velocity-modulation of the scanning electron beam and the disturbance signal due to the parasitic oscillation.

It should be understood that the above described circuit as the embodiment of this invention can be appleid to not only the horizontal deflection output circuit but also the vertical deflection output circuit and other switching circuits such as, for example, switching regulators.

I claim:

1. A horizontal deflection output circuit comprising a means for causing a horizontal deflection current to flow through the horizontal deflection coil in one direction during the period from an intervening instant within the horizontal scanning period to the end of said horizontal scanning period;
a resonance capacitor for generating a resonance current in cooperation with said horizontal deflection coil during the horizontal flyback period; and
a damper diode for bypassing said resonance current and for causing said resonance current to flow through said horizontal deflection coil in the direction opposite to said one direction from the instant corresponding to the end of the rise time of said horizontal deflection current, after the start of the horizontal scanning period, till said intervening instant, wherein said horizontal deflection output circuit is provided with a damping means which assumes a low impedance and serves as a bypass for said resonance current during at least a portion of said rise time, and has no influence on the current through said horizontal deflection coil during any period other than said rise time.

2. A horizontal deflection output circuit as claimed in claim 1, wherein said damping means comprises a series circuit of a resistor and capacitor, said series circuit being connected in parallel with said damper diode, and an auxiliary damper diode connected in parallel with said resistor in such a manner that the conducting direction of said auxiliary damper diode coincides with that of said damper diode.

3. A horizontal deflection output circuit as claimed in claim 1, wherein said damping means is a series circuit of a zener diode and a capacitor, said series circuit being connected in parallel with said damper diode.

4. In a horizontal deflection output circuit having:
a horizontal deflection coil;
switching means having a unidirectional conductive path coupled in parallel to said horizontal deflection coil and a control terminal supplied with a control signal of a horizontal frequency for controlling conductive and non-conductive states of said unidirectional path, and
a damper diode coupled in parallel to said horizontal deflection coil with a conductive polarity opposite to that of said unidirectional conductive path and unavoidably having a rise time to become conductive at the beginning of a horizontal scanning period, the improvement comprising;
damping means coupled in parallel to said damper diode, said damping means being rendered conductive during at least a portion of said rise time and otherwise rendered non-conductive.

5. In a horizontal deflection output circuit having:
a means for causing a horizontal deflection current to flow through the horizontal deflection coil in one direction during the period from an intervening instant within the horizontal scanning period to the end of said horizontal scanning period;
a resonance capacitor for generating a resonance current in cooperation with said horizontal deflection coil during the horizontal flyback period; and
a damper diode for bypassing said resonance current and for causing said resonance current to flow through said horizontal deflection coil in the direction opposite to said one direction from the instant corresponding to the end of the rise time of said horizontal defection current, after the start of the horizontal scanning period, till said intervening instant, the improvement comprising:
damping means coupled in parallel to said damper diode and presenting a low impedance to serve as a bypass for said resonance current during at least a portion of the early stage of said rise time, and a high impedance during any period other than said low impedance period.

* * * * *